(12) United States Patent
Huang et al.

(10) Patent No.: US 6,798,223 B2
(45) Date of Patent: Sep. 28, 2004

(54) TEST METHODS, SYSTEMS, AND PROBES FOR HIGH-FREQUENCY WIRELESS-COMMUNICATIONS DEVICES

(75) Inventors: Guanghua Huang, Prior Lake, MN (US); Gregory Wambeke, Jordan, MN (US)

(73) Assignee: HEI, Inc., Victoria, MN (US)

( * ) Notice: Subject to any disclaimer, the term of this patent is extended or adjusted under 35 U.S.C. 154(b) by 0 days.

(21) Appl. No.: 09/725,646

(22) Filed: Nov. 29, 2000

(65) Prior Publication Data

US 2002/0011856 A1 Jan. 31, 2002

Related U.S. Application Data

(60) Provisional application No. 60/221,550, filed on Jul. 28, 2000.

(51) Int. Cl.[7] ............................................... G01R 31/02
(52) U.S. Cl. .................. 324/754; 324/757; 324/758
(58) Field of Search ........................ 324/754, 755, 324/758, 761, 762, 756, 158.1, 72.5, 757, 688, 149; 33/558, 561; 73/833.5

(56) References Cited

U.S. PATENT DOCUMENTS

| | | | |
|---|---|---|---|
| 4,259,635 A | * 3/1981 | Triplett | 324/149 |
| 4,536,705 A | * 8/1985 | Hayes | 324/556 |
| 4,697,143 A | 9/1987 | Lockwood et al. | |
| 4,791,363 A | * 12/1988 | Logan | 324/754 |
| 4,849,689 A | * 7/1989 | Gleason et al. | 324/754 |
| 4,894,612 A | 1/1990 | Drake et al. | |
| 5,172,053 A | * 12/1992 | Itoyama | 324/758 |
| 5,351,001 A | 9/1994 | Kornrumpf et al. | |
| 5,373,231 A | 12/1994 | Boll et al. | |
| 5,408,188 A | * 4/1995 | Katoh | 324/757 |
| 5,506,515 A | * 4/1996 | Gogshalk et al. | 324/762 |
| 5,563,522 A | * 10/1996 | Abe | 324/758 |
| 5,565,788 A | * 10/1996 | Burr et al. | 324/762 |
| 5,933,015 A | * 8/1999 | Siddiqui | 324/643 |
| 6,023,171 A | * 2/2000 | Boyette, Jr. et al. | 324/754 |
| 6,118,287 A | * 9/2000 | Boll et al. | 324/754 |
| 6,172,497 B1 | * 1/2001 | Okumichi | 324/158.1 |
| 6,191,594 B1 | * 2/2001 | Nightingale et al. | 324/754 |
| 6,242,930 B1 | * 6/2001 | Matsunaga et al. | 324/754 |
| 6,310,483 B1 | * 10/2001 | Taura et al. | 324/754 |
| 6,417,682 B1 | * 7/2002 | Suzuki et al. | 324/755 |

* cited by examiner

*Primary Examiner*—Anjan K. Deb
(74) *Attorney, Agent, or Firm*—Merchant & Gould PC

(57) ABSTRACT

A test probe for a high-frequency device having an electronic circuit with two or more contact regions. The test probe comprises two or more signal probe tips. Each signal probe tip has a contact surface area for contacting one of the contact regions of the device. A ground probe has a ground contact surface with a surface area substantially greater than the contact surface area of the one signal probe tip for contacting another one of the contact regions of the electronic circuit. The ground probe is positioned between at least two of the signal probes.

27 Claims, 8 Drawing Sheets

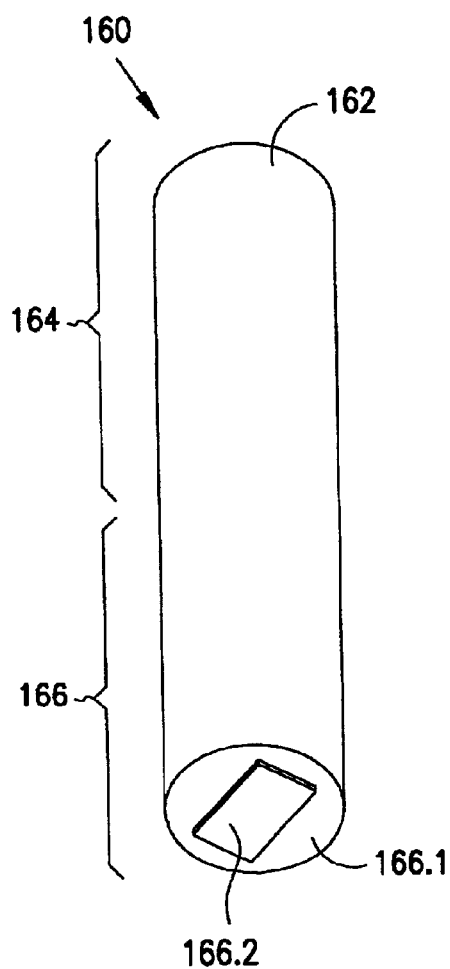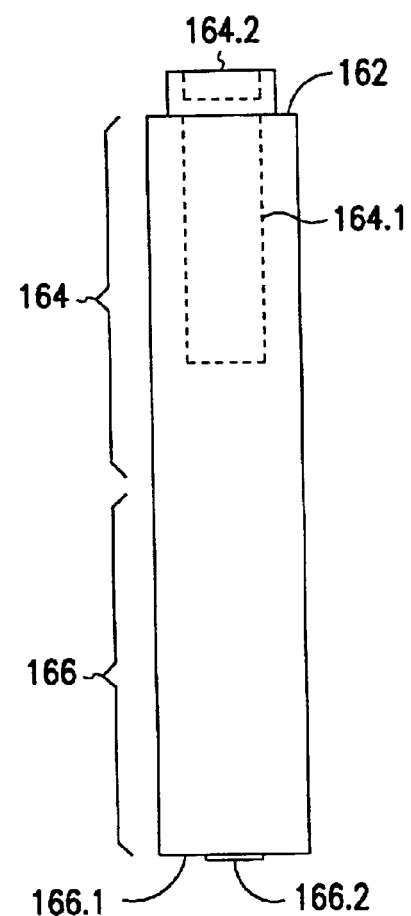
FIG. 5.1
FIG. 5.2

TEST METHODS, SYSTEMS, AND PROBES FOR HIGH-FREQUENCY WIRELESS-COMMUNICATIONS DEVICES

RELATED APPLICATION

The present application is a continuation of U.S. Provisional Application No. 60/221,550, which was filed on Jul. 28, 2000. This application is incorporated herein by reference.

TECHNICAL FIELD

The present invention concerns testing equipment and methods for high-frequency devices, particularly test probes for wireless communications devices.

BACKGROUND OF INVENTION

The increasing popularity of wireless communications devices, such as mobile telephones and pagers, has placed considerable demand on the limited range of broadcast frequencies that the federal government allots for these devices. In response, the federal government has extended this range to include higher frequencies. For example, the range for these devices now includes frequencies in the range of 27–32 Giga-Hertz. (A Giga-Hertz is one billion cycles or oscillations per second.)

In turn, makers of communication devices now offer or intend to offer devices that function at these higher frequencies. At the heart of many of these devices is a multi-tiered electronic assembly, which includes an integrated-circuit chip, a chip carrier, and a main circuit board. The chip is soldered onto one side of the larger, and sturdier, chip carrier. The other side of the chip carrier is soldered to the main circuit board, sandwiching the chip carrier between the chip and the main circuit board. The main circuit board, known as a motherboard, includes circuitry that electrically communicates with the chip through conductors inside and on the surface of the chip carrier.

One important aspect in making these multi-tiered electronic assemblies is testing their electrical capabilities. The conventional testing procedure tests each motherboard with the chip and chip carrier mounted to it. This testing, which is typically done manually, entails using test probes not only to apply test signals to inputs of the motherboard, but also to measure output signals at its outputs. A network analyzer, coupled to the test probe at the outputs, shows whether the output signals are acceptable or unacceptable. Unacceptable assemblies are generally discarded, because of the difficulty in salvaging the chip, chip carrier, or motherboard for reuse.

One conventional type of test probe that is considered suitable for testing high-frequency electronic assemblies is the ground-signal-ground (GSG) single or dual signal-port probe. This probe type places each signal probe tip between two grounded probe tips, which electrically shield the signal probe tip during testing. The ends of the ground and signal tips—that is, the ends which contact the device under test—are substantially identical in structure, each having a sharp pointed end to facilitate its precise placement on conductive portions of the device under test. One example of this type probe is the PICOPROBE brand test probe from GGB Industries. (PICOBROBE appears to be a trademark of GGB Industries.) Another example is shown in U.S. Pat. No. 5,565,788.

There are at least two problems that the present inventors have recognized with high-frequency applications of conventional test probes and test methods. The first problem is that proper probe operation requires the device under test, such as a motherboard assembly, include at least two ground pads, or contacts, next to each signal port being tested. The ground contacts engage the ground probe tips at the sides of the signal probe tip to shield the probe from electrical interference during testing. However, at high frequencies, these adjacent ground pads can generate parasitic resonances which frustrate normal operation of the devices.

The second problem is that conventional test methods only test complete motherboard assemblies—that is motherboards with mounted chips and chip carriers. Because of the difficulty in separating chip carriers from motherboards, defective motherboard assemblies are discarded as waste, increasing manufacturing cost.

Accordingly, there is a need for better test probes and testing methods for high-frequency electronic assemblies.

SUMMARY

To address this and other needs, the present inventors have devised unique test probes for testing high-frequency electronic assemblies, such as those for wireless communications devices. One unique probe structure includes at least one signal contact surface for contacting a signal-port trace of an electronic assembly and at least one ground contact surface for contacting a ground pad of the electronic assembly, with the ground contact surface substantially larger than the signal contact surface. Another unique probe structure includes at least one signal contact surface for contacting the signal-port trace and a ground probe having a contact surface for contacting the ground pad and a non-contact surface for overhanging a portion of the contacted signal-port trace and thereby establishing a characteristic impedance. Other unique probe structures include not only the larger ground contact surface or the ground with a non-contact surface, but also contacts for communicating electrical bias signals to devices under test.

Other aspects of the invention include systems and methods that incorporate one or more of unique probe structures. One exemplary system mounts one or more of the unique probe structures to a programmable XYZ table to facilitate rapid testing of chip-carrier assemblies. And, one exemplary method entails testing one or more millimeter-wave chip-carrier assemblies using a unique probe structure prior to mounting the assembly to a main circuit board, such as a motherboard.

BRIEF DESCRIPTION OF THE DRAWINGS

FIG. 5.1 is a perspective view of a central ground probe 160, one component of test head 100.

FIG. 5.2 is a cross-sectional view of central ground probe 160 taken along line 2—2 in FIG. 5.1.

DETAILED DESCRIPTION OF PREFERRED EMBODIMENTS

The following detailed description, which references and incorporates FIGS. 1–9, describes and illustrates specific embodiments of the invention. These embodiments, offered not to limit but only to exemplify and teach the concepts of the invention, are shown and described in sufficient detail to enable those skilled in the art to make and use the invention. Thus, where appropriate to avoid obscuring the invention, the description may omit certain information known to those of skill in the art.

Figure 1:
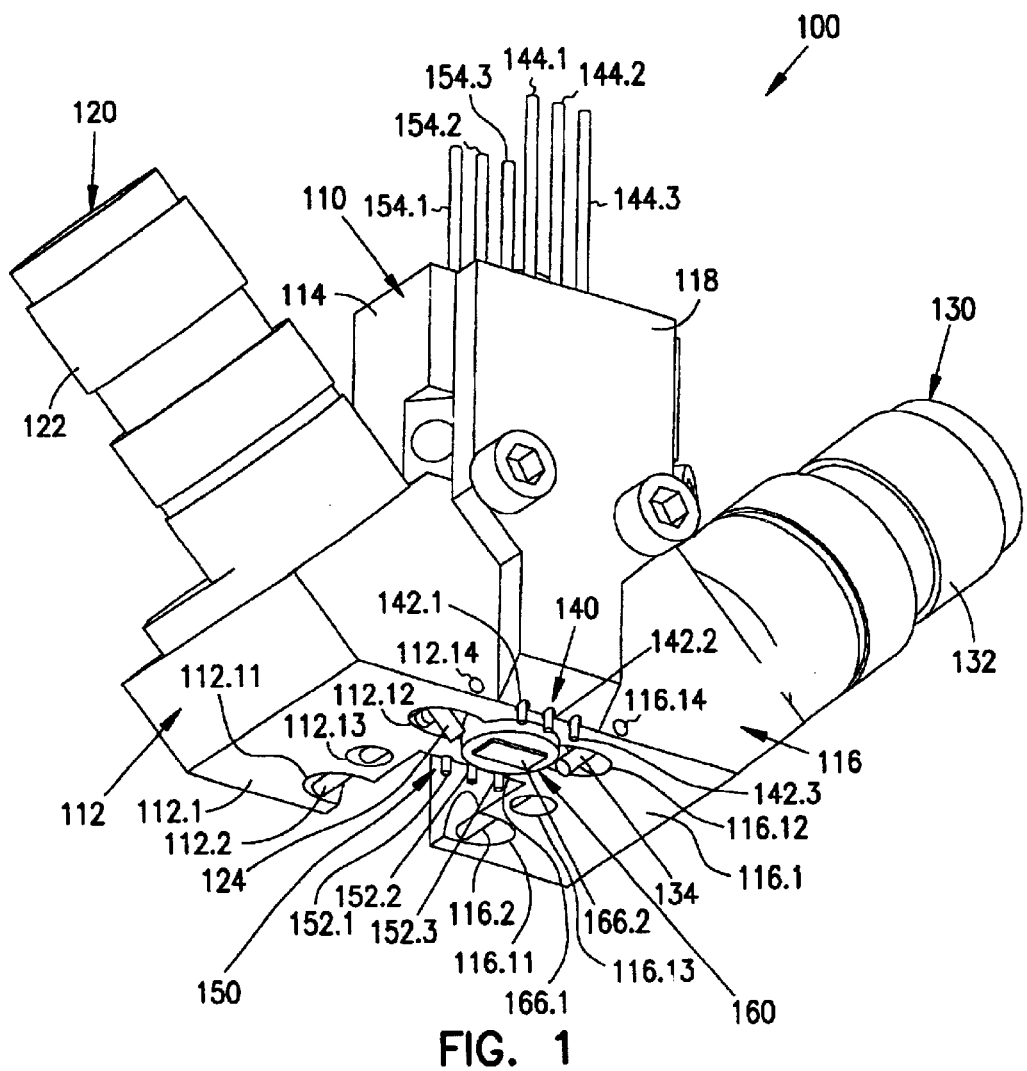
FIG. 1 is a bottom perspective view of a high-frequency test head 100 incorporating teachings of the present invention.

FIG. 1, a bottom perspective view, shows an exemplary high-frequency test head 100 which incorporates teachings of the present invention. Test head 100 includes a probe-support fixture 110, left and right signal probes 120 and 130, front and back DC probes 140 and 150, and a central ground probe 160. Probe-support fixture 110 holds probes 120–160 in a fixed spatial relationship that corresponds to the input-output arrangement of a high-frequency chip-carrier assembly (not shown in this view.) Left and right signal probes 120 and 130 include respective coaxial couplings 122 and 132, and signal probe tips 124 and 134. Front DC probe 140 includes front DC probe tips 142.1, 142.2, and 142.3 which are coupled to respective DC bias feeds 144.1, 144.2, 144.3, and back DC probe 150 includes back DC probe tips 152.1, 152.2, and 152.3 which are coupled to respective back DC bias feeds 154.1, 154.2, and 154.3. Central ground probe 160 includes a ground offset (or non-contact) surface 166.1 and a ground contact 166.2.

More particularly, probe-support fixture 110, which is electrically insulated from probe tips 124 and 134 and DC probes 140 and 150, includes left and right portions 112 and 116, a center portion 114, and a front plate 117. Left portion 112, which supports left signal probe 120, includes a bottom face 112.1 and a tuning conductor 112.2, and right portion 116, which supports right signal probe 130, includes a bottom face 116.1 and a tuning conductor 116.2. Bottom face 112.1 includes notches 112.11 and 112.12 and a hole 112.13, which are linked via a transverse through-hole 112.14 for tuning conductor 112.2. Likewise, bottom face 116.1 includes notches 116.11 and 116.12 and a hole 116.13, which are linked via a transverse through-hole 116.14 for tuning conductor 116.2.

Figure 2:
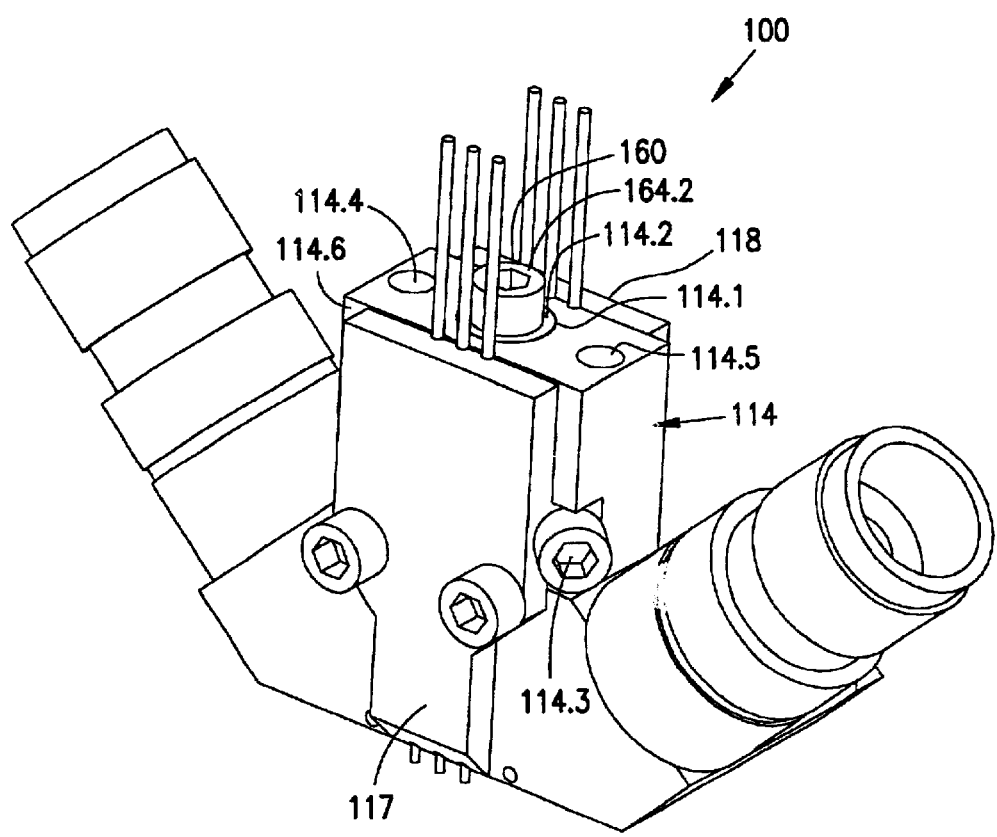
FIG. 2 is top perspective view of exemplary test head 100 in FIG. 1.
Figure 6:
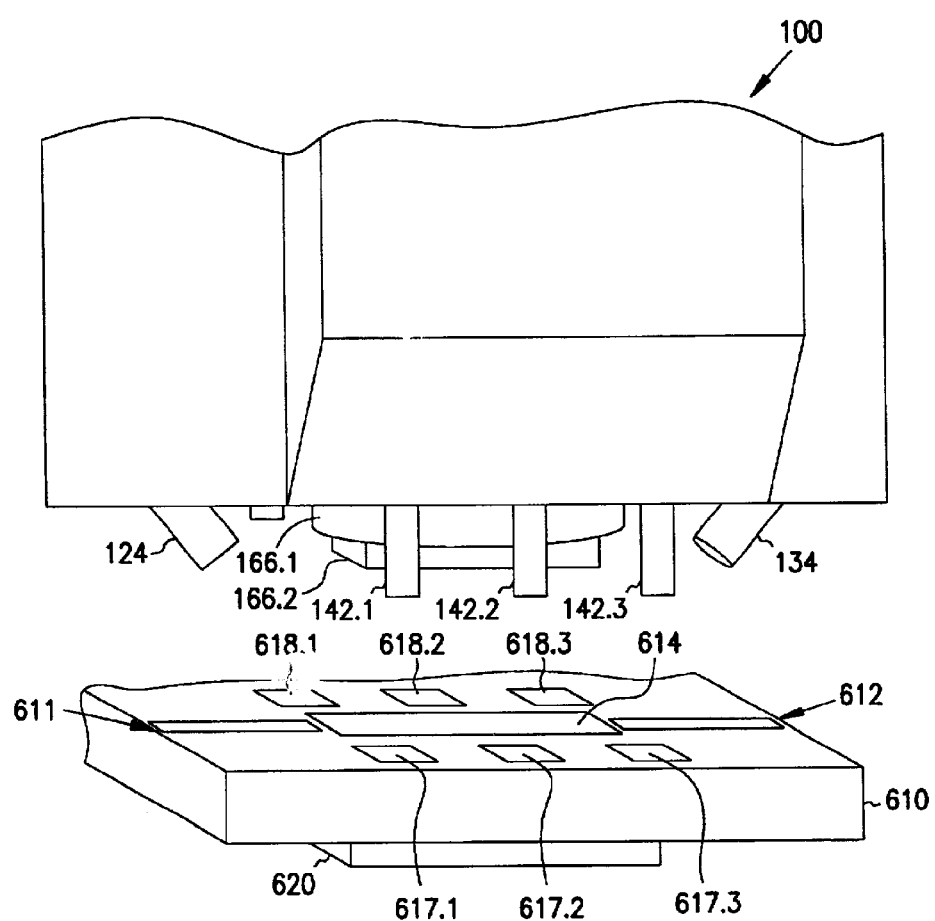
FIG. 6 is a perspective view of test head 100 in overhead alignment with an exemplary chip-carrier assembly 600.
Figure 7:
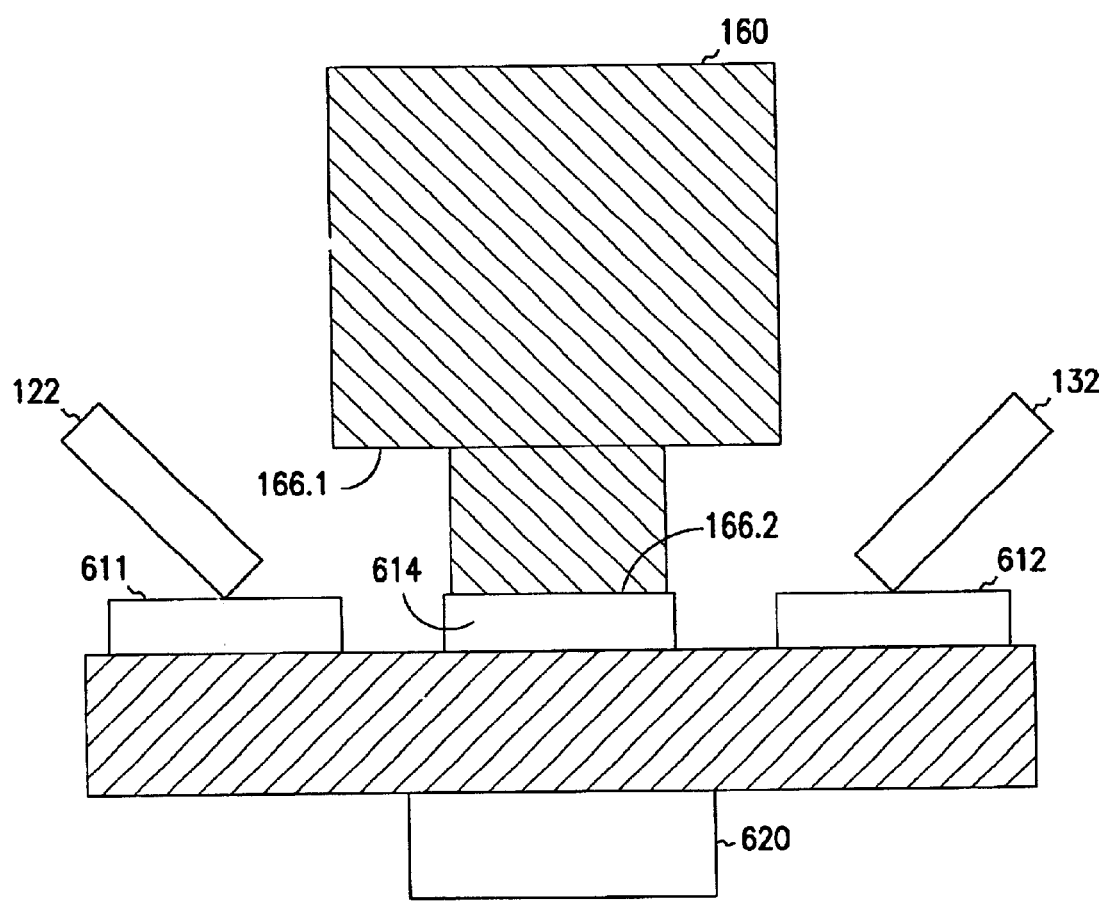
FIG. 7 is a simplified cross-sectional view of test head 100 in contact with signal port traces 611 and 612 and ground pad 614 of chip-carrier assembly 600.

FIG. 2, a top perspective view of test head 100, shows that center portion 114 includes a central bore 114.1 which directly contacts ground probe 160. (Some embodiments may insulate probe 160 from portion 114.) A screw 164.2 in probe 160 facilitates rotation of probe 160 within bore 114.1, and a set screw 114.3 fixes the vertical and angular position of ground probe 160 within center portion 114 of fixture 110. Additionally, set screw 114.3 allows one to replace ground probe 160 with another ground probe providing a different characteristic impedance or the same characteristic impedance for a different device under test. (Holes 114.4 and 114.5 are used for mounting the test head to an actuation assembly as shown in FIGS. 6 and 7.)

Figure 3:
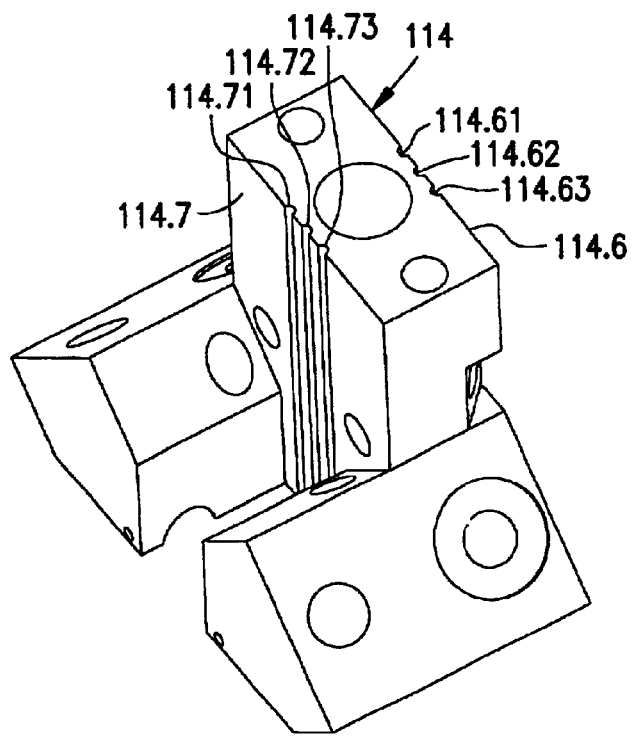
FIG. 3 is a top perspective view of probe-support fixture 110, a component of test head 100.

FIG. 3, a top perspective view of probe-support structure 110, shows that center portion 114 further includes front and back surfaces 114.6 and 114.7 which confront respective interior surfaces of front plate 117 and a back plate 118 (shown in FIG. 2.) Front surface 114.6 includes substantially parallel grooves 114.61, 114.62, and 114.63. Back surface 114.7 includes substantially parallel grooves 114.71, 114.72, and 114.73.

Figure 4:
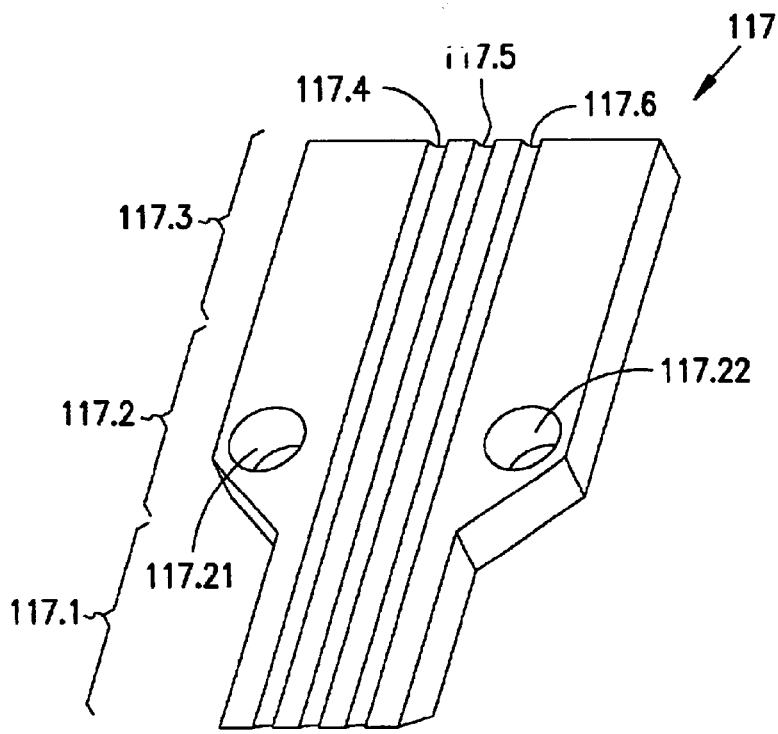
FIG. 4 is a back perspective view of front plate 117, another component of test head 100.

FIG. 4 shows a perspective view of front plate 117, which is structurally identical to back plate 118. Front plate 117 includes respective narrow, broad, and intermediate sections 117.1, 117.2, and 117.3 as well as parallel grooves 117.4 117.5, and 117.6. Narrow section 117.1 terminates in a 45-degree bevel; intermediate section 117.2 includes holes 117.21 and 117.22 and tapers at 45 degrees from narrow section 117.1 to broad section 117.3. Grooves 117.4, 117.5, and 117.6 correspond to those of front surface 114.6. Front DC bias feeds 144.1, 144.2, and 144.3 are sandwiched respectively between grooves 11.71, 114.72, and 114.73 and grooves 117.4, 117.5, and 117.6. Similarly, back DC bias feeds 154.1, 154.2, and 154.3 are sandwiched respectively between grooves 114.71, 114.72, and 114.73 of the back surface 114.7 and corresponding grooves (not shown) in back plate 118 (in FIG. 2).

FIGS. 5.1 and 5.2 show respective perspective and cross-sectional views of central ground probe 160. Ground probe 160 includes a conductive cylindrical shaft 162 of substantially uniform diameter of 0.125 inches (3.17 millimeters) for example. Shaft 162 has an upper portion 164 and a lower portion 166. Upper portion 164 includes a central axial bore 164.1 and a screw 164.2. Screw 164.2 allows one to adjust the angular orientation of probe 160 relative to other portions of probe 100. In the exemplary embodiment, axial bore 164.1 has an approximate diameter of 0.10 inches (2.50 millimeters) and an approximate depth of 0.20 inches (7.88 millimeters.) Lower portion 166 includes a ground offset surface 166.1 and a ground contact surface 166.2. Ground contact surface 166.2 in the exemplary embodiment is a rectangular solid, with an exemplary depth of about 0.0045 inches (0.114 millimeters), an exemplary length of about 0.082 inches (2.08 millimeters), and an exemplary width of about 0.048 inches (1.22 millimeters.)

When ground contact 166.2 contacts a ground contact of a device under test that has adjacent signal ports, a portion of ground offset surface 166.1 overhangs a portion of an one or more of the adjacent signal port trace of the device under test. Assuming an appropriate offset between surfaces 166.1 and 166.2 relative to the width of the adjacent signal trace, this arrangement establishes a desired characteristic impedance. For example, an offset of about 4.3 mils (0.144 millimeters) with a trace width of about 18 mils (0.457 millimeters) forms a nominal characteristic impedance of 50 Ohms.

The exemplary embodiment machines probe-support structure 110 from aluminum 6061-T6 and finishes it with 0.00001-inch-thick, 24-carat-gold plating over 0.0002-inch-thick nickel. Front and back plates 117 and 118, and ground probe 160 are fabricated similarly.

FIG. 6 shows how exemplary test head 100 is intended to engage a exemplary high-frequency chip-carrier assembly (or surface-mount package) 600. Chip-carrier assembly 600 includes a chip-carrier substrate 610 and an integrated circuit chip 620. Though not shown, the exemplary embodiment provides chip 620 with a lid or cover for protection.

More particularly, chip-carrier substrate 610 includes two high-frequency signal port traces or contacts 611 and 612, a central ground pad 614, and low-frequency or direct-current (DC) bias pads 617 and 618. Signal-port traces 611 and 612, which have a rectangular shape in this embodiment, are positioned directly opposite each other. Central ground pad 614, which has an exemplary rectangular shape or peripheral outline, lies centered not only between signal-port traces 611 and 612, but also between DC bias pads 617 and 618. DC bias pads 617 includes a collinear arrangement of three pads 617.1, 617.2, and 617.3 on one side of carrier 610, and DC bias pads 618 includes a collinear arrangement of three pads 618.1, 618.2, and 618.3.

FIG. 6 further shows that various portions of test head 100 are aligned with portions of chip-carrier assembly 600. Specifically, left and right signal probe tips 124 and 134 are aligned to contact respective signal port traces 611 and 612, front (and back) DC bias probe tips 142.1, 142.2, 142.3 are aligned to contact DC bias pads 617.1, 617.2, and 617.3, and central ground probe 160 is aligned to contact central ground pad 614. (The figure does not clearly show alignment of back DC bias probe tips 152.1, 152.2, 152.3 with DC bias pads 618.1, 618.2, and 618.3, although this is what is intended in the exemplary embodiment. Also, it is intended in the exemplary embodiment that ground contact 166.2 register precisely with pad 614.)

FIG. 7 shows a simplified cross-sectional view of left and right signal probes 120 and 130 and ground probe 160 of test head 100 in contact respectively with signal port traces 611 and 612 and ground pad 614. Notably, when ground contact 166.2 contacts ground pad 614, left and right portions of ground offset surface 166.1 overhang respective portions of signal port traces 611 and 612. Assuming an appropriate depth (or height) of ground contact 166.2 (which establishes the distance between offset surface 166.1 signal port traces 611 and 612, this arrangement sets a desired characteristic impedance between ground surface and the signal port trace. For example, in this embodiment, a depth of 0.0043 inches (0.114 millimeters) sets a characteristic impedance of 50 ohms. Replacement of the ground probe with another allows one to reconfigure the test head for other characteristic impedances, and/or electronic assemblies with other contact distributions, shapes, and/or dimensions.

Other embodiments provide alternative ground probe dimensions and structures to effect impedance matching. For examples, some embodiments provide ground contact 166.2 as a set of two or more ground contact points. Variants of these embodiments form the ground contact points in hemispherical or conic forms. Still other embodiments provide the ground contact points as a set of angled fingers, similar in form to probe tips 124 and 134 to cushion impact of test head 100 with chip-carrier assembly 600. Other embodiments may combine rigid or resilient contacts with one or more other resilient conductive or nonconductive features, such a spring member, to facilitate a soft landing of the ground probe.

Additionally, some embodiments provide the ground probe with a variable offset-surface-to-contact-surface distance. For example, in some embodiments, ground contact surface is part of an axial insert within a cylindrical or rectangular ground sleeve. The ground sleeve has an end face which functions as an offset surface, and the axial insert slides within the sleeve, allowing one to adjust and set the distance between the offset surface and the contact surface and thus to set the characteristic impedance of the probe. Other more complex fine tuning mechanisms are also feasible with this variable mechanism. Indeed, with an automated adjustment mechanism and suitable feedback electronics, it is conceivable to dynamically match the characteristic impedance of the probe to each device under test in a mass-production environment using an automated test system.

Figure 8:
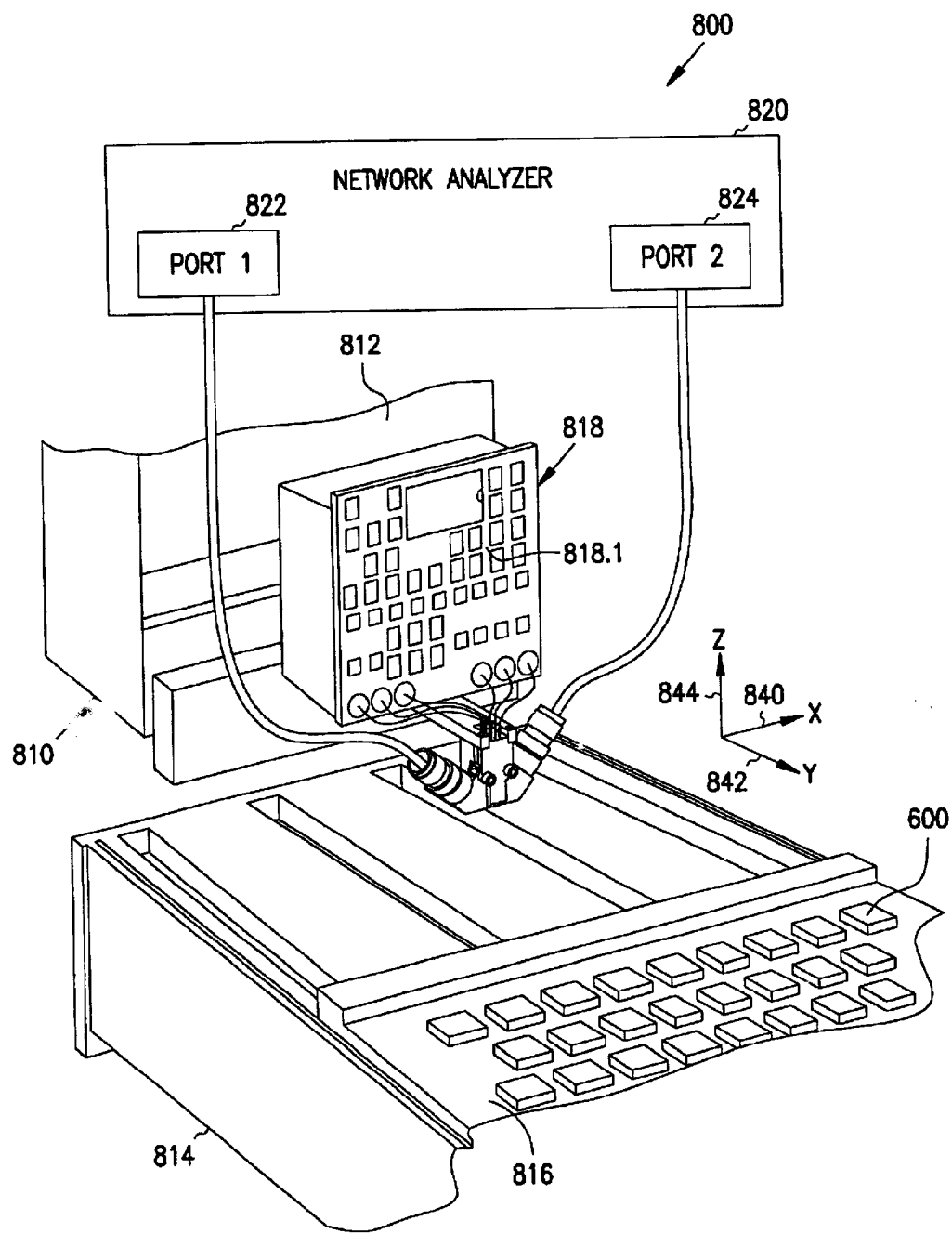
FIG. 8 is a perspective view of an exemplary test system 800 which incorporates exemplary test head 100.

FIG. 8 shows an exemplary test system 800 that incorporates exemplary test head 100. In addition to test head 100, system 800 includes a programmable XYZ table 810, and a network analyzer 820. XYZ table 810 includes an x-axis translator 812, an y-axis translator 814, a substrate holder 816, and a z-axis translator 818. X-axis translator 812 moves z-axis translator 818 along an x-axis dimension 840, and y-axis translator 814 moves substrate holder 816, which holds one or more exemplary chip-carrier assemblies 600, along a y-axis dimension 842 perpendicular to the x-axis dimension. Z-axis translator 818, which includes bias circuitry 818.1 coupled to the dc bias feeds of test head 100, moves the test head along a z-axis dimension 844, perpendicular to the x- and y-axes, to engage its probe tips with each of chip-carrier assemblies 600 on substrate holder 816. Network analyzer 820 includes network-analyzer ports 822 and 824.

In exemplary operation, a programmed computer controller (not shown) controls XYZ table 810, using x-axis and y-axis translators 812 and 814 to align z-axis translator 818, more precisely test head 100, over one of the chip-carrier assemblies on substrate holder 816. After achieving this two-dimensional alignment, the controller operates z-axis translator 818 to bring test head 100, specifically signal probe tips 124 and 134 into contact with respective signal port traces 611 and 612; front and back DC probe tips 142 and 152 into contact with respective DC bias pads 617 and 618; and central ground probe 160 into contact with central ground pad 614, as indicated in FIGS. 6 and 7.

Some embodiments control movement of the test head in the z-dimension by established a predetermined stopping point for the test head. Other embodiments use the sensed flow of electrical current through the bias circuitry as a stop signal for downward movement of the test head. And still other embodiments may force gas through a nozzle mounted adjacent the test head on to the substrate or substrate holder, sense back pressure as the test head moves downward, and cease movement when the back pressure exceeds a certain threshold. Yet other embodiments may use optical control methods.

Contact of one or more of the probes, such as ground probe 160 with ground pad 614, completes an electrical circuit for the DC bias circuitry 818*a* to apply appropriate DC bias voltages, through DC probes 140 and 150 to bias pads 617 and 618. Control software senses the flow of current through the bias feeds, and waits a predetermined period of time, for example 10 seconds, to allow for establishing a steady-state condition. Once the steady-state condition is established, the control software directs network analyzer to output a test signal, for example in the 27–32 Giga-Hertz range, from port 822, through left signal probe 120, and into signal-port trace 611 of chip-carrier assembly 600.

Assembly 600 outputs a signal through signal-port trace 612 and right signal probe 130 to network-analyzer port 824. Network analyzer 820 measures one or more electrical properties (such as S-parameters, power, delay, and so forth), compares the one or more measured properties to acceptance criteria, and records the results of the test along with a part identifier for the chip-carrier assembly, indicating whether the assembly has passed or failed. The controller then operates the z-axis translator to disengage the test head from the chip-carrier assembly; operates the x-axis and y-axis translators to align the test head with the next chip-carrier assembly for testing. Those assemblies that pass the test will be mounted to a motherboard or other circuitry using conventional mounting procedures, whereas those that fail will be discarded or salvaged.

Figure 9:
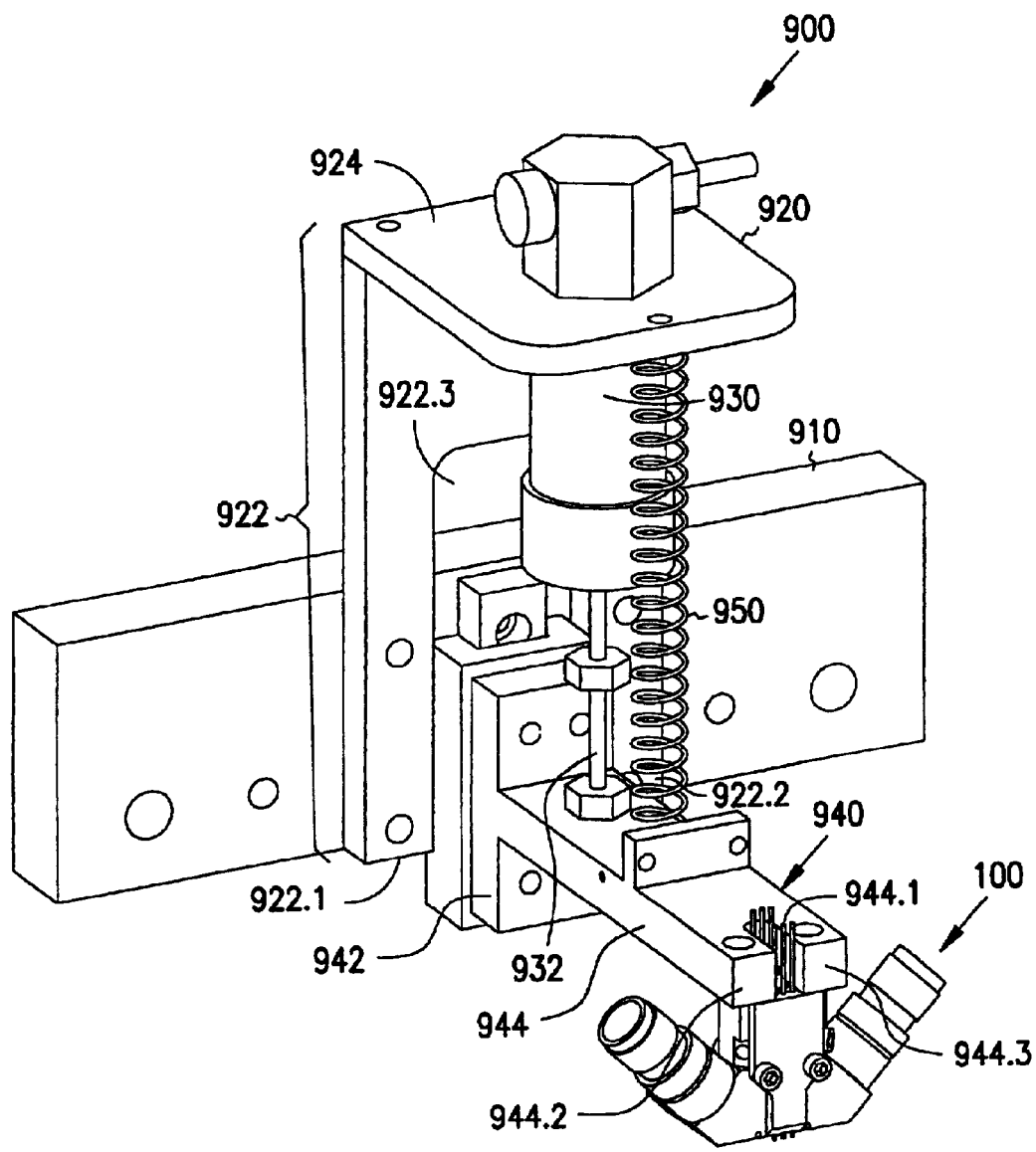
FIG. 9 is a perspective view of a z-axis translator 818, one component of test system 800 in FIG. 8.

FIG. 9 shows a perspective view of exemplary z-axis translator 818 without bias circuitry 818.1. Translator 818 includes a spring-biased vertical actuation assembly 900, which is shown in its extended or actuated position. Assembly 900 includes table-mount bracket 910, an actuator bracket 920, an actuator 930, a test-head bracket 940, and a bias spring 950.

Table-mount bracket 910, which is used to fasten assembly 900 to y-axis translator 814, is fastened or secured to left and right stem portions 922.1 and 922.2 of actuator bracket 920. Actuator bracket 920, which forms an inverted "L," includes a lower stem portion 922 and an upper portion 924. Stem portion 922 includes a central slot 922.3 between left and right portions 922.1 and 922.2. Fastened to upper portion 924 is one end of actuator 930.

Actuator 930, which in various embodiments is hydraulic, pneumatic, or electric, includes a rod 932 mounted to test-head mount bracket 940. Test-head bracket 940 forms a "T", and includes an upper portion 942 and a lower portion 944. Upper portion 942 slidably engages central slot 922.3. Lower portion 944 includes a slot 944.1, which defines left and right end portions 944.2 and 944.3. Slot 944.1 receives front and back DC bias feeds 144 and 154 of test head 100, and left and right end portions 944.2 and 944.3 are fastened to test head 100 using its holes 114.4 and 114.5 (shown in FIG. 2).

Bias spring 950, which is connected between lower portion 944 and upper portion 924 of actuator bracket 920, bias the actuator toward a disengaged position, that is, away from substrate holder 816 (in FIG. 8.)

CONCLUSION

In furtherance of the art, the inventors have presented unique test probes and related systems and methods for testing high-frequency electronic assemblies, such as those for wireless communications devices. One unique probe structure includes at least one signal contact surface for contacting a signal-port trace of an electronic assembly and at least one ground contact surface for contacting a ground pad of the electronic assembly, with the ground contact surface substantially larger than the signal contact surface. Another unique probe structure includes a non-contact ground surface for overhanging a portion of the contacted signal-port trace and thereby establishing a characteristic impedance. And yet another includes conductors for communicating electrical bias signals to devices under test.

The embodiments described above are intended only to illustrate and teach one or more ways of making and using the present invention, not to restrict its breadth or scope. The actual scope of the invention, which embraces all ways of practicing or implementing the teachings of the invention, is defined only by the following claims and their equivalents.

What is claimed is:

1. A test probe for a high-frequency device having an electronic circuit with two or more contact regions, the test probe comprising:
   two or more signal probe tips, each signal probe tip having a contact surface area for contacting one of the contact regions of the device; and
   a ground probe having a ground contact surface with a surface area substantially greater than the contact surface area of the one signal probe tip for contacting another one of the contact regions of the electronic circuit, wherein the ground contact surface is positioned between at least two of the signal probe tips.

2. The test probe of claim 1, wherein the contact surface area of the ground contact surface is at least ten times greater than the contact surface area of the one signal probe tip.

3. The test probe of claim 2, wherein the ground contact surface comprises two or more noncontiguous contact regions.

4. The test probe of claim 2, wherein the ground contact surface consists of a continuous contact surface.

5. The test probe of claim 1, wherein the ground probe has a non-contact surface substantially parallel to the contact surface and spaced from the contact surface of the ground probe to define a nominal characteristic impedance when the contact surface of the ground probe contacts the other one of the contact regions of the device.

6. The test probe of claim 1, further comprising a coaxial connector coupled to the signal probe tip.

7. The test probe of claim 1, wherein the device includes at least one DC contact region for receiving a DC bias input, and wherein the test probe further comprises at least one DC bias tip for contacting the one DC contact region and providing a DC bias signal.

8. The test probe of claim 1 wherein the ground probe is removable to allow its replacement with another ground probe.

9. The test probe of claim 1, wherein the electronic circuit is mounted on a work surface and one signal probe tip has a tip axis which defines a non-right angle with the work surface.

10. A test system for testing two or more microwave devices, with each device having at least one signal port, at least one ground pad, and at least one DC input-output pad, the system comprising:
    a work surface for supporting the two or more microwave devices;
    a test head including:
      two or more signal probe tips, each signal probe tip having a contact surface area for contacting a signal port of a first one of the microwave devices;
      a first ground probe having a ground contact surface with a contact surface area substantially greater than the contact surface area of the one signal probe tip for contacting the one ground pad of the first one of the microwave devices, wherein the first ground contact surface is positioned between at least two of the signal probe tips; and
      programmable means for sequentially moving the test head into alignment with each of the microwave devices on the work surface and for bringing the signal probe tip into contact with the one signal port of each microwave device and the contact surface of the first ground probe into contact with the one ground pad of each microwave device.

11. The test fixture of claim 10:
    wherein the test head further comprises at least one DC probe tip for contacting the one DC-input-output pad of the first one of the microwave devices; and
    wherein the test fixture further comprises a DC bias circuit coupled to the one DC probe tip.

12. The test fixture of claim 10 wherein the first ground probe is removable to allow its replacement with a second ground probe having a second ground contact surface with a second contact surface area that differs from that of the first ground probe.

13. The test fixture of claim 10, wherein the one signal probe tip has a tip axis which defines a non-right angle with the work surface.

14. A test probe comprising:
    first and second signal probe tips, the first and second signal probe tips have respective first and second contact areas; and a single ground structure fixed between the first and second probe tips, the single ground structure including a ground contact area which is greater than at least one of the first and second contact areas.

15. The test probe of claim 14, wherein the ground structure includes a ground contact surface and non-contact surface substantially parallel to the ground contact surface and offset from the contact surface.

16. A method of testing microwave or high-frequency devices, with each device having at least one signal port, at least one ground pad, and at least one DC input-output pad, the method comprising:
providing a test head comprising two or more signal probe tips, each probe tip having a contact surface area, and a first ground probe having a ground contact surface with a ground contact surface area substantially greater than the contact surface area of the one signal probe tip, the ground contact surface being positioned between at least two of the signal probe tips;
moving the contact surface of each of the signal probe tips into contact with a signal port of a first one of the devices and the contact surface of the first ground probe into contact with the one ground pad of the first one of the devices, thereby establishing a signal path between two of the signal probe tips positioned on opposite sides of the ground contact surface.

17. The method of claim 16, further comprising:
measuring or analyzing an electrical signal communicated through the signal probe tip after moving the signal probe tip into contact with the one signal port of the first one of the devices.

18. The method of claim 17, further comprising:
determining whether the first one of the devices is acceptable or unacceptable based the measurement or analysis of the electrical signal;
moving the signal probe tip into contact with the one signal port of a second one of the devices and the contact surface of the first ground probe into contact with the one ground pad of the second one of the devices;
measuring or analyzing an electrical signal communicated through the signal probe tip after moving the signal probe tip into contact with the one signal port of the second one of the devices; and
determining whether the second one of the devices is acceptable or unacceptable based on the measurement or analysis of the electrical signal.

19. A method of testing a device comprising a high-frequency electronic assembly having at least first and second conductive regions, the method comprising:
providing a test head having first and second test-head contacts;
establishing electrical communication between the first test-head contact and the first conductive region and between the second test-head contact and the second conductive region;
sensing electrical communication between the first test-head contact and the first-head conductive region;
automatically introducing a test signal through the second test-head contact into the electronic assembly in response to sensing electrical communication between the first test-head contact and second conductive region.

20. The method of claim 19, wherein establishing electrical communication between the first test-head contact and the first conductive region comprises establishing a DC current between the first test-head contact and the first conductive region.

21. The method of claim 20, wherein automatically introducing a test signal through the second test-head contact into the electronic assembly comprises introducing a signal having a frequency greater than one Giga-Hertz.

22. The method of claim 20, wherein automatically introducing a test signal through the second test-head contact into the electronic assembly comprises introducing the test signal a predetermined time period after sensing electrical communication between the first test-head contact and the first-head conductive region.

23. For a surface-mount package having first and second signal ports and a ground pad between the signal ports, a method of establishing an electrical coupling of a predetermined nominal characteristic impedance with at least the first signal ports, the method comprising:
contacting the first signal port with a first electrical conductor;
contacting the ground pad with a ground probe, with the ground probe having a ground contact and a surface overhanging a major surface of the signal port and being substantially parallel to the major surface; and
adjusting the depth of the ground contact thereby positioning the overhanging portion of the ground probe a predetermined distance from the first signal port and establishing a predetermined impedance of the first signal port.

24. The method of claim 23, wherein the surface of the ground probe overhanging the major surface of the signal port establishes an electrical field perpendicular to the surface of the ground pad and the major surface of the signal port.

25. A method comprising:
providing a test head having first and second conductive probes for contacting respective conductive portions of a first electronic assembly and establishing a first nominal characteristic impedance; and
changing at least one of the first and second conductive probes to enable the test head to establish a second nominal characteristic impedance different from the first nominal characteristic impedance or to establish the first nominal characteristic impedance with a different arrangement of conductive portions on a second electronic assembly.

26. The method of claim 25, wherein changing at least one of the first conductive probes comprises replacing the first conductive probe with a different conductive probe.

27. The method of claim 26, wherein the first conductive probe is a ground probe.

* * * * *